United States Patent [19]
Shan et al.

[11] Patent Number: 5,948,168
[45] Date of Patent: *Sep. 7, 1999

[54] DISTRIBUTED MICROWAVE PLASMA REACTOR FOR SEMICONDUCTOR PROCESSING

[75] Inventors: Hongching Shan, San Jose; Harald Herchen, Fremont; Michael Welch, Pleasanton, all of Calif.

[73] Assignee: Applied Materials, Inc., Santa Clara, Calif.

[*] Notice: This patent is subject to a terminal disclaimer.

[21] Appl. No.: 08/947,820

[22] Filed: Oct. 9, 1997

Related U.S. Application Data

[62] Division of application No. 08/494,297, Jun. 23, 1995, Pat. No. 5,702,530.

[51] Int. Cl.$^6$ .................................................. C23C 16/00
[52] U.S. Cl. .......................... 118/723 R; 118/723 MW; 118/723 I; 118/723 E; 118/723 IR; 118/723 ER; 118/724; 118/50.1; 156/345
[58] Field of Search .................... 118/723 E, 723 ER, 118/723 I, 723 IR, 723 AN, 723 MW, 723 ME, 723 MR, 723 MA, 724, 50.1; 156/345

[56] References Cited

U.S. PATENT DOCUMENTS

| | | | |
|---|---|---|---|
| 5,017,404 | 5/1991 | Paquet et al. | 427/45.1 |
| 5,102,523 | 4/1992 | Beisswenger et al. | 204/298.33 |
| 5,496,410 | 3/1996 | Fukuda et al. | 118/723 MW |
| 5,702,530 | 12/1997 | Shan et al. | 118/723 MP |

Primary Examiner—R. Bruce Breneman
Assistant Examiner—Luz Alejandro
Attorney, Agent, or Firm—kv Robert Wallace

[57] ABSTRACT

A plasma reactor has plural dielectric gas injection tubes extending from a gas injection source and through a microwave guide and into the top of the reactor chamber. The semiconductor wafer rests near the bottom of the chamber on a wafer pedestal connected to a bias RF power source which is controlled independently of the microwave source coupled to the microwave guide. The microwaves from the waveguide ignite and maintain a plasma in each of the tubes. Gas flow through the tubes carries the plasmas in all the tubes into the chamber and into contact with the wafer surface.

29 Claims, 3 Drawing Sheets

DISTRIBUTED MICROWAVE PLASMA REACTOR FOR SEMICONDUCTOR PROCESSING

This is a division, of application Ser. No. 08/494,297, filed Jun. 23, 1995, now U.S. Pat. No. 5,702,530.

BACKGROUND OF THE INVENTION

1. Technical Field

The invention is related to microwave plasma reactors for processing semiconductor wafers to perform etch or chemical vapor deposition or similar processes on the wafer.

2. Background Art

A plasma reactor may be employed to perform various processes on a semiconductor wafer in microelectronic fabrication. The wafer is placed inside a vacuum chamber of the reactor and reactant gases are introduced into the chamber. The gases are irradiated with electromagnetic energy to ignite and maintain a plasma. Depending upon the composition of the gases from which the plasma is formed, the plasma may be employed to etch a particular thin film from the wafer or may be employed to deposit a thin film layer onto the wafer. In order to maximize processing throughput, it is desirable that the plasma have a high ion density. High ion density provides, for example, a high etch rate on the wafer, so that less time is required to perform a given etch process, thereby increasing throughput. To provide a high density plasma, a large amount of electromagnetic power must be applied to the plasma, which may increase ion energy in addition to increasing plasma ion density. The problem is that unduly high ion energy tends to damage microelectronic devices on the wafer, thus decreasing device yield. This problem is avoided in the prior art by employing reactors in which the ion density and the ion energy may be controlled independently.

One conventional type of plasma reactor in which ion density and ion energy are separately controllable is an inductively coupled plasma reactor in which ion density is determined by the amount of radio frequency (RF) power applied to an inductive coil antenna surrounding the reactor chamber while ion energy is separately determined by the amount of RF power applied to a pedestal underlying the wafer. A disadvantage of such an inductively coupled plasma reactor is that such RF powered coil antennas tend to be inefficient in maintaining plasmas uniformly across the chamber. Another disadvantage is that the power loss through the coil is a very sensitive function of the Q-factor of the coil, and process repeatability is relatively poor.

Another conventional type of plasma reactor with independent control of ion energy and ion density employs electron cyclotron resonance (ECR) to produce microwaves to ignite and maintain the plasma in the chamber. While ECR reactors are more efficient in producing a plasma because of the relatively high frequency of the microwaves (compared with the RF frequencies employed in inductively coupled plasma reactors), ECR plasma reactors require delicate control of the location and magnitude of external magnetic fields. Moreover, ECR works well only at very low chamber pressures, since at higher pressures electron collisions with neutral species suppress the required resonance.

It is therefore an object of the invention to provide a plasma reactor which enjoys the advantages of both the inductively coupled plasma reactor and the ECR plasma reactor without encountering the problems of either.

In conventional plasma reactors, reactant gases are combined in a manifold and then delivered to the reactor chamber via a single gas feed line to a gas distribution plate in the ceiling of the chamber. The gas distribution plate has many gas flow orifices in an area overlying the wafer, and the placement of these orifices determines whether the gas flow is uniform across the wafer surface. Since the orifices are permanent features of the gas distribution plate, their precise placement for optimum uniformity of gas flow must be learned through expensive and time-consuming trial-and-error experiments. Typically, gas distribution patterns are tailored for a specific application (e.g., chemical vapor deposition of a particular material to a particular thickness over a particular layer for a particular size wafer), so that for each such application the trial-and-error method of optimizing placement of the gas orifices in the gas distribution plate must be repeated.

It is therefore a further object of the present invention to eliminate the need for customizing each gas distribution plate with such an inefficient trial-and-error method.

SUMMARY OF THE DISCLOSURE

A plasma reactor has plural dielectric gas injection tubes extending from a gas injection source and through a microwave guide and into the top of the reactor chamber. The semiconductor wafer rests near the bottom of the chamber on a wafer pedestal connected to a bias RF power source which is controlled independently of the microwave source coupled to the microwave guide. The microwaves from the waveguide ignite and maintain a plasma in each of the tubes. Gas flow through the tubes carries the plasmas in all the tubes into the chamber and into contact with the wafer surface.

One advantage of the use of many gas injection tubes is that a higher plasma etch rate is achieved in those cases in which the invention is employed in plasma etch applications. Since there is a significant amount of heat transferred from the plasma to the tube, the total amount of microwave power that can be applied to the plasma tube is limited to avoid melting the tube. With plural tubes, however, the heat transfer to each individual tube is decreased because it is distributed among all tubes. Therefore, more power can be applied for a higher etch rate. For similar reasons, the plasma erosion of each tube is reduced in proportion to the number of tubes, so that the apparatus is more durable.

Another advantage is that with the higher (microwave) frequencies employed in the invention, loss to surrounding surfaces (e.g., chamber walls) is reduced and electron-enhanced ionization and dissociation is increased, so that plasma generation is more efficient. Moreover, unlike inductively coupled plasmas, there is no power loss to a coil, so that at a given applied power level, the invention provides higher plasma ion density. A further advantage is that the external magnets of a conventional ECR reactor are eliminated. Another advantage is that the invention can operate across a much wider range of chamber pressures than an ECR plasma reactor.

Gas flow is independently adjustable through each tube, for ready optimization of gas flow uniformity over the wafer surface. Individual reactant gases are mixed together to form a homogeneous reactant gas mixture for the plasma. A programmable flow divider then provides the homogeneous mixture to each tube at an individually selectable flow rate, so that a different flow rate may be selected for each different gas orifice in the gas distribution plate. The flow rates are instantaneously adjustable for fast optimization of gas flow uniformity across the entire wafer surface.

DETAILED DESCRIPTION OF THE PREFERRED EMBODIMENTS

Figure 1A:
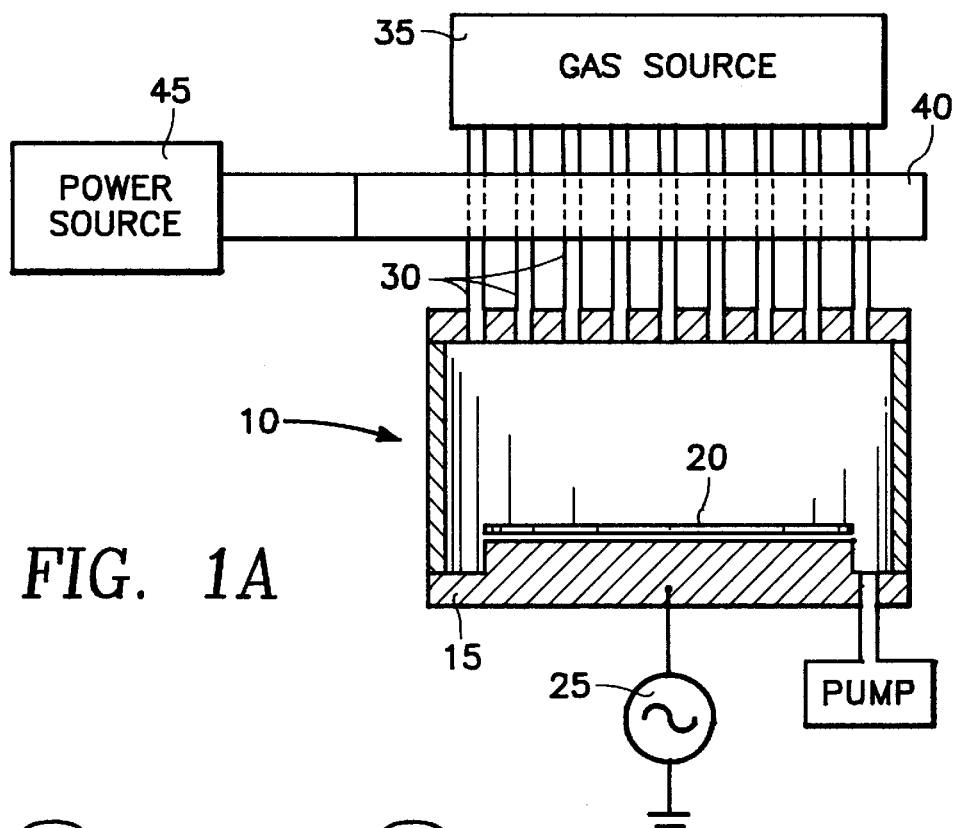
FIG. 1A is an elevational view of an embodiment of the invention.
Figure 2:
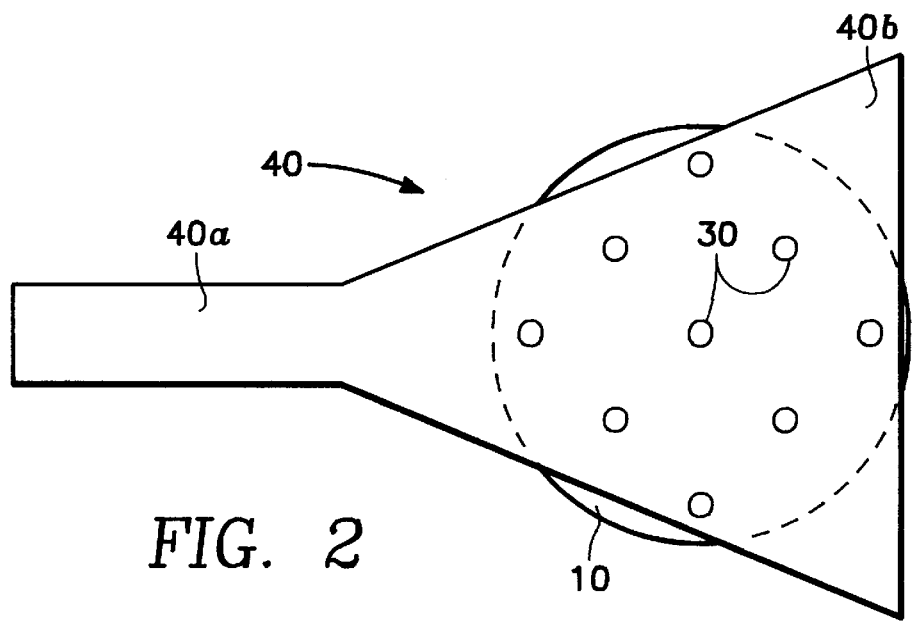
FIG. 2 is a top view corresponding to FIG. 1.

Referring to FIGS. 1A and FIG. 2, a distributed plasma reactor has a vacuum chamber 10, a wafer pedestal 15 supporting a semiconductor wafer 20 within the chamber 10, and an external bias RF power source 25 connected to the wafer pedestal 15. Plural gas injection tubes 30 extend from a reactant gas source 35 through an electromagnetic radiation applicator 40 and into the ceiling of the chamber 10 toward the wafer 20. The gas source 35 injects a selected mixture of reactant gases into each one of the tubes 30 at a selected flow rate. Power from a radiation source 45 is radiated by the applicator 40 to ionize the reactant gases in those portions of the tubes 30 extending through the applicator 40, to form a plasma therein. The gas flow through each tube 30 carries the plasma into the chamber 10 so that the top surface of the wafer 20 is enveloped in the plasma.

Figure 1B:
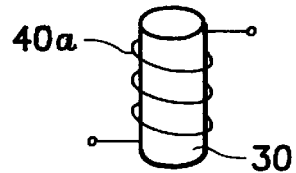
FIG. 1B is a portion of a gas flow tube of the embodiment of FIG. 1A and an inductive RF power applicator
Figure 1C:
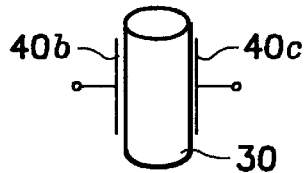
FIG. 1C is a portion of a gas flow tube of the embodiment of FIG. 1A and a capacitive RF power applicator.

In a preferred embodiment, the radiation applicator 40 is a microwave waveguide and the radiation source 45 is a microwave generator. Alternatively, the source 45 is an RF power generator, in which case the applicator 40 may be either a set of coil inductors 41a wound around the respective tubes (FIG. 1B) or a pair of capacitor plates 41b, 41c connected across the RF source 45 (FIG. 1C). In the case of the pairs of capacitor plates, there may be a pair of capacitor plates 41b, 41c radially sandwiching each tube 30 or only a single pair sandwiching the entire ensemble of tubes.

The ion density of the plasma in the chamber is determined by the amount of microwave power delivered by the microwave generator 45. The ion energy at the top surface of the wafer 20 is independently determined by the amount of power delivered by the bias RF generator 25. The etch rate is determined by several parameters including gas flow rate (through each tube 30), and the ion density (determined by the microwave generator 45). The ion bombardment or sputtering rate is determined by the ion velocity (set by the bias generator 25).

In one embodiment there are nine tubes 30 symmetrically disposed relative to the wafer 20. Each one of the tubes 30 is preferably a dielectric material, such as quartz or sapphire, with a diameter of about 2.5 cm and a length of about 30 cm. The microwave source 45 may have a frequency of about 2.45 GHz at about 2 kiloWatts. The microwave guide 40 preferably has a vertical depth of about 5.0 cm and includes a neck 40a coupled to the microwave source 45 having a length of about 7.5 cm and a width of about 5.0 cm. The waveguide 40 further includes a triangular main section 40b having a length of about 30 cm and a maximum width of about 30 cm. The microwave guide 40 may be formed of any suitable conductor such as copper or aluminum, for example.

One advantage of the use of many gas injection tubes is that a higher plasma etch rate is achieved in those cases in which the invention is employed in plasma etch applications. Since there is a significant amount of heat transferred from the plasma to the tube, the total amount of microwave power that can be applied to the plasma tube is limited to avoid melting the tube. With plural tubes, however, the heat transfer to each individual tube is decreased because it is distributed among all tubes. Therefore, more power can be applied for a higher etch rate. For similar reasons, the plasma erosion of each tube is reduced in proportion to the number of tubes, so that the apparatus is more durable.

Another advantage is that with the higher (microwave) frequencies employed in the invention, loss to surrounding surfaces (e.g., chamber walls) is reduced and electron-enhanced ionization and dissociation is increased, so that plasma generation is more efficient. Moreover, unlike inductively coupled plasmas, there is no power loss to a coil, so that at a given applied power level, the invention provides higher plasma ion density. A further advantage is that the external magnets of a conventional ECR reactor are eliminated. Another advantage is that the invention can operate across a much wider range of chamber pressures than an ECR plasma reactor.

While the invention has been described with reference to preferred embodiments in which the plasma in each tube is generated by microwave radiation, any suitable radiation source may be employed to ionize the gases in each tube, including microwave, RF radiation or any frequency of electromagnetic radiation.

A preferred embodiment of the reactant gas source 35 will now be described. In this preferred embodiment, etch rate uniformity across the wafer surface is enhanced by independently adjusting gas flow rates at individual zones of the wafer surface.

Figure 3:
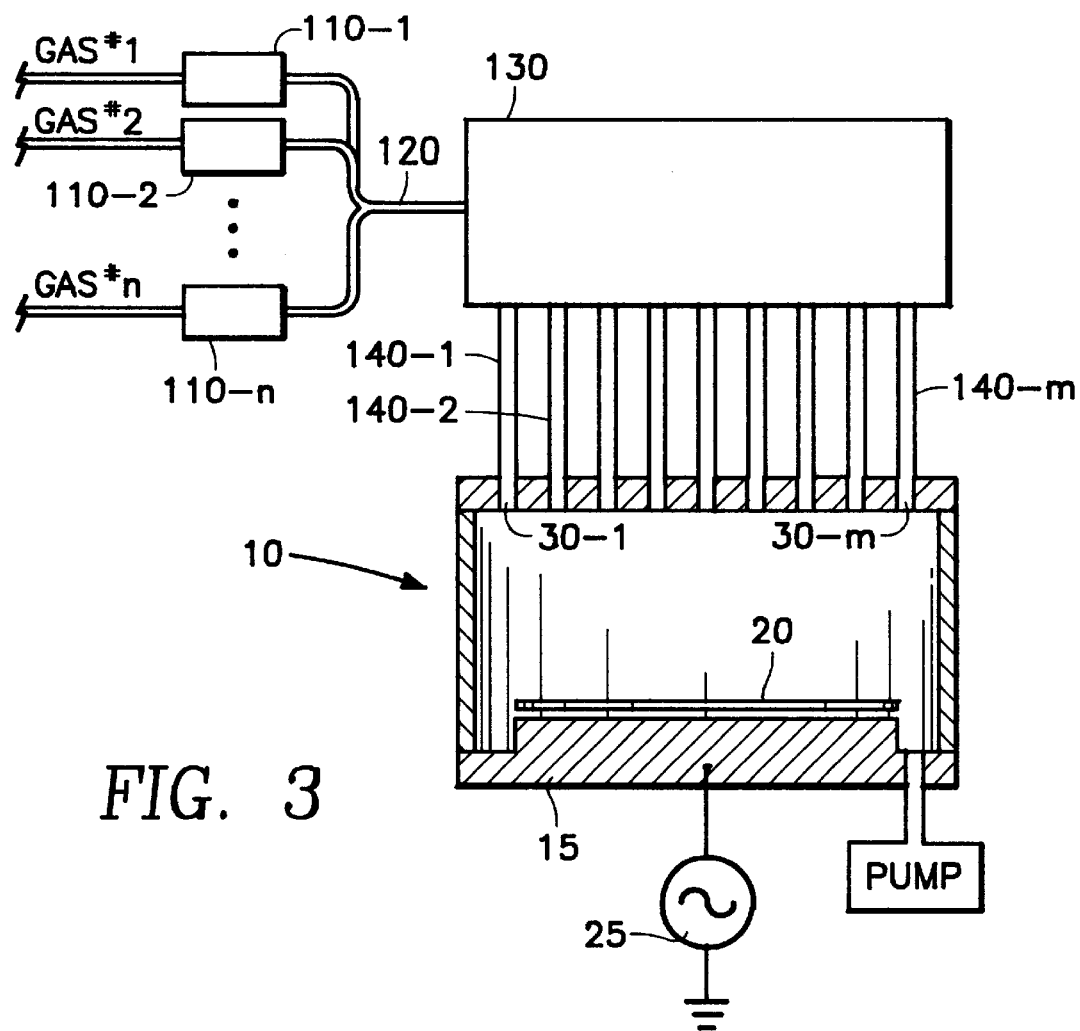
FIG. 3 is a top view of the embodiment of FIG. 1A in which the power applicator is a microwave waveguide.

Referring to FIG. 3, individual reactant gases (labelled gas #1 through gas #n in FIG. 3) are fed through respective conventional mass flow controllers 110-1 through 110-n to a common gas feed line 120 where the individual gases become a homogeneous mixture. This mixture is fed by the line 120 to a programmable gas flow divider 130 having m gas output lines 140-1 through 140-m. Each output line 140 is connected to a respective one of the m gas flow tubes 30-1 through 30-m.

Figure 4:
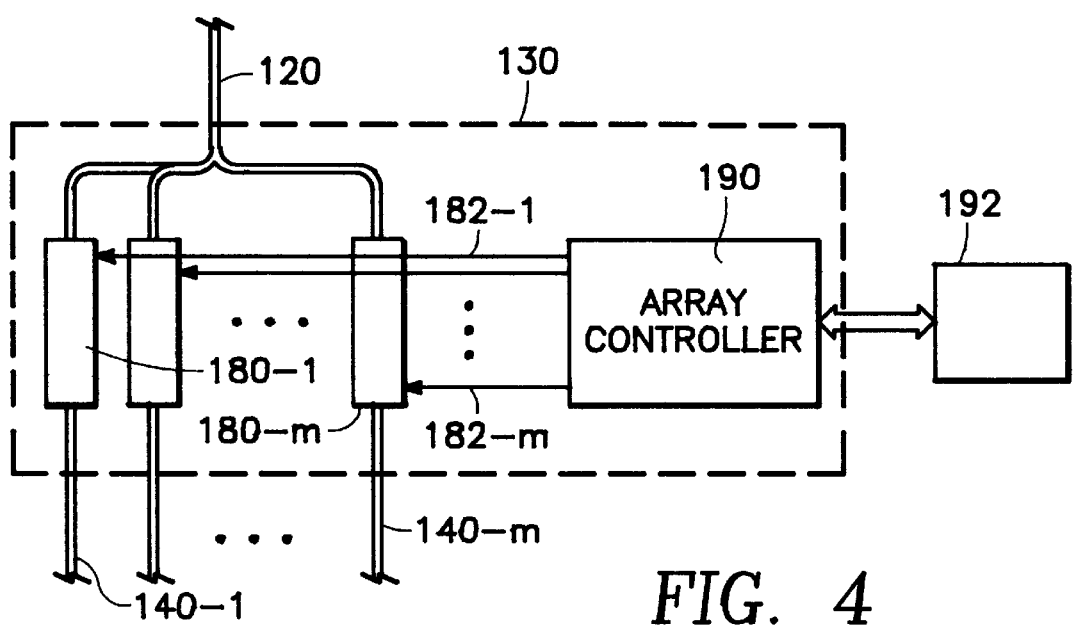
FIG. 4 is a schematic diagram of a programmable gas flow divider employed in the embodiment of FIG. 3.

Referring to FIG. 4, the programmable gas flow divider 130 may be implemented in one embodiment by m conventional mass flow controllers 180-1 through 180-m. Each one of the mass flow controllers 180-1 through 180-m receives the homogeneous gas mixture from the feed line 120 and supplies an individually selected flow rate of the homogeneous gas mixture to a respective one of the output lines 140-1 through 140-m. The individual gas flow rate through each mass flow controller 180 is varied or set by an electrical signal applied to an electrical control input line 182 connected to an electrical control input of the mass flow controller. All of the control lines 182-1 through 182-m are connected to an array controller 190 which permits the user to exercise instantaneous control over each mass flow controller 180 in the array of mass flow controllers 180-1 through 180-m. The array controller 190 may have a standard computer interface 192 permitting instantaneous computerized control over the flow rate through each one of the mass flow controllers 180-1 through 180-m.

Figure 5:
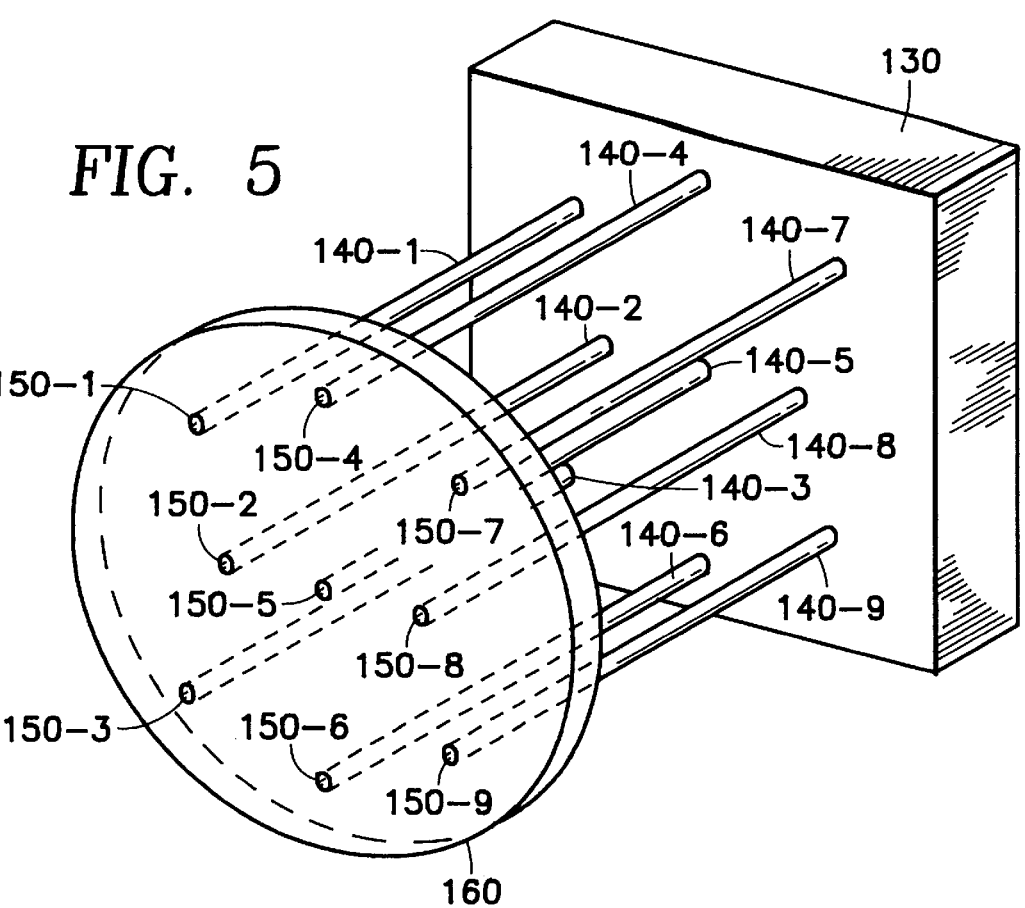
FIG. 5 is a perspective view of a gas distribution plate and programmable gas flow divider employed in the embodiment of FIG. 3.
Figure 6:
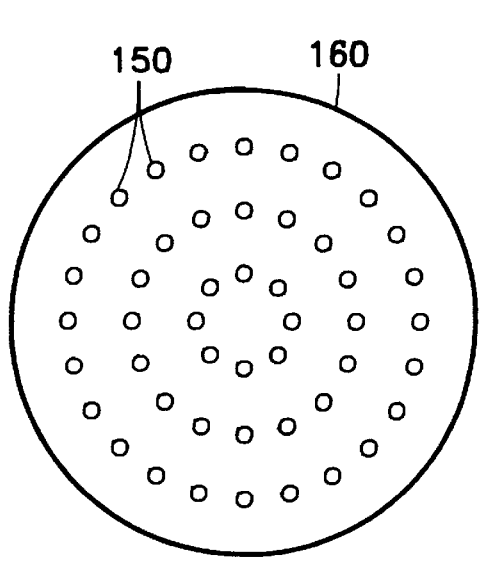
FIG. 6 is a bottom view of a gas distribution plate which may be used in the embodiment of FIG. 3.

FIG. 5 illustrates a rudimentary implementation of the ceiling 160 of the chamber 10 having about nine gas flow tubes 150-1 through 150-8 connected to eight gas output lines 140-1 through 140-8 from the programmable gas flow divider 130. FIG. 6 shows a preferred embodiment having a large number of tubes 150 which are closely spaced, enabling very fine high resolution control of the gas flow pattern over the wafer surface. Preferably, for processing an eight-inch diameter semiconductor wafer, the array of tubes 150 intersecting the ceiling 160 has a diameter of about 10 inches and has about 100 gas flow tubes 150.

Figure 7:
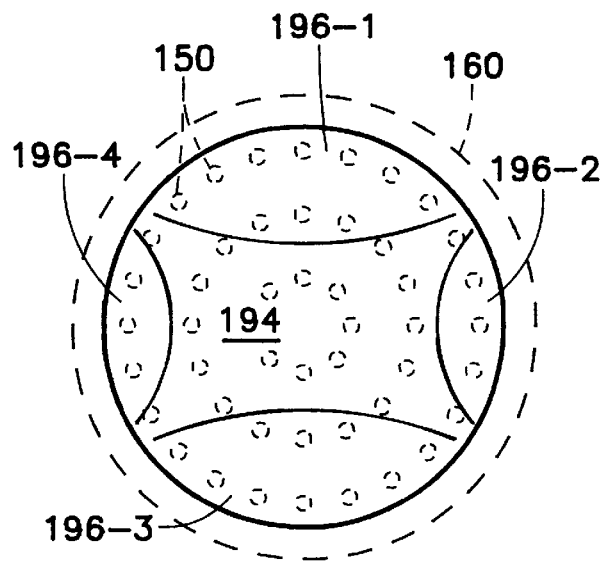
FIG. 7 is a graph illustrating the gas flow distribution non-uniformity across the wafer surface as compensated by the invention.

FIG. 7 illustrates how the mass flow controllers 180 to might be individually set to precisely compensate for non-uniformities in gas flow across the wafer surface. Specifically, a region 194 centered over the wafer and having arcuately stretched corners tends to have a low gas flow rate (and therefore low etch rate) while four adjoining regions 196-1 through 196-4 constituting the remaining area overlying the wafer have high gas flow rates. To obtain a uniform gas flow rate, those mass flow controllers 180 connected to tubes 150 overlying the center region 194 are set to a relatively high flow rate while the remaining mass flow controllers (which are connected to the tubes 150 overlying the remaining areas 196-1 through 196-4) are set to lower flow rates, and these flow rates are so adjusted until a uniform gas flow rate is achieved across the entire wafer surface.

While the invention has been described in detail by reference to preferred embodiments, it is understood that variations and modifications thereof may be made without departing from the true spirit and scope of the invention.

What is claimed is:

1. A plasma rector comprising:
   a vacum chamber and a wafer supporter for holding a semiconductor wafer in said chamber;
   a reactant gas source for furnishing at least a reactant gas;
   plural gas flow channels extending from said reactant gas source and into said chamber, said reactant gas source establishing gas flow rates in respective gas flow channels whereby said reactant gas flows through each of said channels toward said chamber each of said plural tubes having an intermediate portion lying between said reactant gas source and said chamber; and
   a radiation applicator for irradiating an interior of said intermediate portion of each of said channels whereby to provide a plasma therein, the flow rates in said channels being sufficient to transport the plasma in each channel into said chamber, said radiation applicator comprising one of: (a) a waveguide through which said intermediate portion of each one of said channels extends, (b) inductor coils wound around respective channels, (c) a capacitor plate facing at least one of said channels.

2. The reactor of claim 1 wherein:
   said radiation applicator comprises a microwave generator; and
   said waveguide comprises a microwave guide further comprising a fan-shaped major portion through which said channels extend and a neck coupled to an apex of said fan-shaped major portion.

3. A plasma reactor, comprising:
   a vacuum chamber and a wafer supporter for holding a semiconductor wafer in said chamber;
   a reactant gas source for furnishing at least a reactant gas;
   plural channels extending from said reactant gas source and into said chamber, each of said plural channels having an intermediate portion lying between said reactant gas source and said chamber; and
   a waveguide through which said intermediate portion of each one of said channels extends for irradiating an interior of said intermediate portion of each of said channels whereby to provide a plasma therein, each of said channels having a flow rate sufficient to transport the plasma in each channel into said chamber.

4. The reactor of claim 3 wherein:
   said waveguide comprises a microwave guide having a fan-shape major portion through which said channels extend and a neck coupled to an apex of said fan-shape major portion, and wherein said waveguide further comprises a microwave generator coupled to said neck.

5. A plasma reactor including a reactor chamber for processing a substrate therewithin in a subatmospheric gaseous environment, said chamber being adapted to accept an external supply gas, and an external supply of electromragnetic radiation, said reactor comprising:
   a workpiece support;
   a plurality of gas flow channels extending into said reactor chamber and terminating in respective orifices directing gas toward said workpiece support with said chamber, each of said channels adapted to communicate with a supply of gas external to said reactor chamber; and
   a waveguide extending about each channel through which said channels extend which trabsmits electromagnetic radiation from an external source of electromagnetic radiation to locations adjacent each of said channels;
   wherein gas flowing through each tube is ignited into a plasma.

6. A plasma reactor, comprising:
   a vacuum chamber and a wafer supporter for holding a semiconductor wafer in said chamber;
   a reactant gas source for furnishing at least a reactant gas;
   a radiation applicator outside said chamber; and
   plural gas flow channels outside of said chamber, each having a hollow interior and plural respective individually adjustable valves, said channels extending from said reactant gas source and through a ceiling of said chamber, a portion of each one of said channels extending through said radiation applicator for irradiation of an interior of each of said channels whereby to irradiate said reactant gas therein, such that said irradiated reactant gas can be transported through said channels toward said chamber, said reactant gas source establishing gas flow rates in respective ones of said gas flow channels in accordance with adjustments of respective ones of said valves whereby said reactant gas flows through each of said channels toward said chamber.

7. The reactor of claim 6 wherein said irradiated reactant gas is not sufficiently ionized to form a plasma.

8. The reactor of claim 6 wherein said gas source comprises:
   a valve apparatus for individually supplying said reactant gas to respective ones of said channels at respective individual gas flow rates.

9. The reactor of claim 8 wherein said valve apparatus for individually supplying said reactant gas to respective ones of said channels comprises plural mass flow controllers, each one of said mass flow controllers having a gas input connected to a common supply, a gas output connected to a respective one of said channels and an electrical control input for setting a gas flow rate between said input and output in accordance with an electrical signal applied to said control line.

10. The apparatus of claim 9 further comprising an array controller connected to each said control line for simultaneously controlling individual gas flow rates through each of said channels.

11. The reactor of claim 6 wherein said radiation applicator comprises an inductive applicator.

12. The reactor of claim 11 wherein said inductive applicator comprises an inductor coil surrounding said plural gas flow channels.

13. The reactor of claim 6 wherein said radiation applicator comprises inductor coils surrounding respective ones of said plural gas flow channels.

14. The reactor of claim 6 wherein said radiation applicator comprises a capacitive applicator.

15. The reactor of claim 14 wlherein said capacitive applicator comprises a pair of capacitor plates sandwiching said plural gas flow channels.

16. The reactor of claim 6 wherein said radiation applicator comprises capacitor plates radially sandwiching respective ones of said plural gas flow.

17. A plasma reactor, comprising:
a vacuum chamber and a wafer supporter for holding a semiconductor wafer in said chamber;
a reactant gas source for furnishing at least a reactant gas;
plural gas flow channels extending from said reactant gas source and through a ceiling of said chamber, said reactant gas source establishing gas flow rates in respective ones of said plural gas flow channels whereby said reactant gas flows through each of said channels toward said chamber, each of said plural gas flow channels having an intermediate portion lying between said reactant gas source and said chamber;
a radiation applicator for irradiating an interior of said intermediate portion of respective ones of said channels whereby to irradiate said reactant gas therein, the gas flow rates in said channels being sufficient to transport said irradiated reactant gas in each channel into said chamber;
said radiation applicator comprises a waveguide;
said waveguide comprises a fan-shaped main portion through which said channels extend and a neck coupled to an apex of said fan shaped main portion, and wherein said radiation applicator further comprises a source of electromagnetic radiation coupled to said neck; and
said source of electromagnetic radiation comprises a microwave generator, and wherein said waveguide comprises a microwave guide.

18. The reactor of claim 17 wherein said irradiated reactant gas is not sufficiently ionized to form a plasma.

19. In a plasma reactor for processing a semiconductor wafer inside a vacuum chamber, a method for providing uniform gas flow rates across a wafer surface, said method comprising:
providing an array of gas distribution channels outside of said chamber, each of said channels having a hollow interior and plural respective individually adjustable valves, said channels extending through a ceiling of said chamber such that said channels are facing said wafer;
providing a gas flow supply to supply a reactant gas;
supplying gas to respective ones of said gas distribution channels from said gas flow supply at respective individual gas flow rates; and
irradiating portions of each of said channels outside of said chamber with sufficient radiation to irradiate said reactant gas within said channels, whereby to furnish said irradiated reactant gas from said channels to said chamber.

20. The method of claim 19 wherein said irradiated reactant gas is not sufficiently ionized to form a plasma.

21. A plasma reactor, comprising:
a vacuum chamber and a wafer supporter for holding a semiconductor wafer in said chamber; a reactant gas source for furnishing at least a reactant gas;
a radiation apparatus outside said chamber; and
plural gas flow channels outside of said chamber, each having a hollow interior and plural respective individually adjustable valves, said channels extending from said reactant gas source and through a ceiling of said chamber, a portion of each one of said channels extending through said radiation apparatus for irradiation of an interior of each of said channels whereby to irradiate said reactant gas therein, such that said irradiated reactant gas can be transported through said channels toward said chamber.

22. The reactor of claim 21 wherein said irradiated reactant gas is not sufficiently ionized to form a plasma.

23. A plasma reactor, comprising:
a vacuum chamber and a wafer supporter for holding a semiconductor wafer in said chamber;
a reactant gas source for furnishing at least a reactant gas;
plural gas flow channels extending from said reactant gas source and through a ceiling of said chamber, each of said plural gas flow channels having an intermediate portion lying between said reactant gas source and said chamber;
a radiation apparatus for irradiating an interior of said intermediate portion of each of said channels whereby to irradiate said reactant gas therein, the gas flow rates in said channels being sufficient to transport said irradiated reactant gas in each of said channels into said chamber;
said radiation apparatus comprises a waveguide;
said waveguide comprises a fan-shaped main portion through which said channels extend and a neck coupled to an apex of said fan-shaped main portion, and wherein said radiation apparatus further comprises a source of electromagnetic radiation coupled to said neck; and
said source of electromagnetic radiation comprises a microwave generator, and wherein said waveguide comprises a microwave guide.

24. The reactor of claim 23 wherein said irradiated reactant gas is not sufficiently ionized to form a plasma.

25. A plasma reactor, including a reactor chamber for processing a substrate therewithin in a subatmospheric gaseous environment, said plasma reactor being adapted to accept an external supply of gas, and an external supply of electromagnetic radiation, said plasma reactor comprising:
a workpiece support;
a plurality of gas flow channels outside of said chamber, each having a hollow interior and plural respective individually adjustable valves, said channels extending through the ceiling of said reactor chamber and terminating in respective orifices directing gas towards said workpiece support within said chamber, each of said plural gas flow channels adapted to communicate with a supply of gas outside of said plasma reactor; and
an electromagnetic radiation applicator outside said chamber through which each of said plural gas flow channels extend and transmitting electromagnetic radiation from an external source of electromagnetic radiation to locations within each of said plural gas flow channels;

whereby gas flowing through each of said plural gas flow channels is irradiated, said irradiated gas being transported into said chamber and directed toward said workpiece support.

26. The reactor of claim 25 wherein said irradiated gas is not sufficiently ionized to form a plasma.

27. The reactor of claim 25 wherein said plural gas flow channels comprise at least five individual channels.

28. The reactor of claim 25 wherein said plural gas flow channels conmrise at least nine individual channels.

29. The reactor of claim 25 wherein said plural gas flow channels comprise chabbels each with a diameter of less than one-fifth of diameter of said chamber.

* * * * *